(12) United States Patent
Le et al.

(10) Patent No.: US 7,037,847 B2
(45) Date of Patent: May 2, 2006

(54) METHODS FOR FABRICATING READ SENSOR FOR MAGNETIC HEADS WITH REDUCED READ TRACK WIDTH

(75) Inventors: Quang Le, San Jose, CA (US); Sue Siyang Zhang, Saratoga, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 60 days.

(21) Appl. No.: 10/856,679

(22) Filed: May 28, 2004

(65) Prior Publication Data

US 2005/0277299 A1    Dec. 15, 2005

(51) Int. Cl.
*H01L 21/302* (2006.01)
*H01L 21/461* (2006.01)

(52) U.S. Cl. ...................... 438/712; 438/241
(58) Field of Classification Search ............... 438/712, 438/238, 241, 258, 680, 692, 694, 671, 736, 438/745, 961
See application file for complete search history.

(56) References Cited

U.S. PATENT DOCUMENTS

| | | | |
|---|---|---|---|
| 6,232,235 B1 | 5/2001 | Cave et al. ................. 438/715 |
| 6,312,874 B1 | 11/2001 | Chan et al. ................. 430/314 |
| 6,519,118 B1 * | 2/2003 | Chang et al. ............... 360/317 |
| 6,673,684 B1 | 1/2004 | Huang et al. ............... 438/299 |
| 6,696,365 B1 | 2/2004 | Kumar et al. ............... 438/706 |
| 6,778,364 B1 * | 8/2004 | Dobisz et al. ......... 360/324.12 |
| 6,785,101 B1 * | 8/2004 | Webb et al. ............. 360/324.1 |
| 6,920,021 B1 * | 7/2005 | Mauri et al. ................ 360/322 |
| 2002/0081854 A1 | 6/2002 | Morrow et al. ............. 438/694 |
| 2002/0086547 A1 | 7/2002 | Mui et al. ................... 438/710 |
| 2002/0173163 A1 | 11/2002 | Gutsche ..................... 438/736 |
| 2002/0179570 A1 | 12/2002 | Mathad et al. ............... 216/67 |
| 2003/0080088 A1 | 5/2003 | Kagami et al. ............... 216/41 |
| 2003/0129840 A1 | 7/2003 | Kumar et al. ............... 438/694 |
| 2004/0061982 A1 * | 4/2004 | Lin et al. ................. 360/324.1 |
| 2005/0007705 A1 * | 1/2005 | Dobisz et al. ........... 360/324.1 |
| 2005/0147924 A1 * | 7/2005 | Cornwell et al. ........... 430/320 |

* cited by examiner

*Primary Examiner*—David Nhu
(74) *Attorney, Agent, or Firm*—Robert O. Guillot; Intellectual Property Law Offices

(57) ABSTRACT

The fabrication of the read head sensor components where chemical mechanical polishing (CMP) stop layer is deposited above the sensor layers, a first reactive ion etch (RIE) layer and a second RIE layer are deposited, where the second RIE layer is etchable with a different ion species than the first RIE layer. A stencil layer is then deposited and patterned to create an etching stencil having the desired magnetic read track width of the sensor. An RIE step is then conducted in which the second RIE layer is etched. An RIE step for the first RIE layer is then conducted with a different ion species. Thereafter, the sensor layers are milled where the remaining portions of the first and second RIE layers act as a milling mask. A CMP assisted liftoff step is then conducted in which the remaining portions of the ion milling mask are removed.

24 Claims, 8 Drawing Sheets

METHODS FOR FABRICATING READ SENSOR FOR MAGNETIC HEADS WITH REDUCED READ TRACK WIDTH

BACKGROUND OF THE INVENTION

1. Field of the Invention

The present invention relates generally to methods for fabricating read sensors for magnetic heads, and more particularly to methods for reducing the magnetic read track width of the sensor.

2. Description of the Prior Art

Magnetic heads for hard disk drives typically contain a read head element for reading magnetic data bits from the magnetic media disk, and a write head for writing magnetic data bits onto the magnetic media disk. Focusing on the read head element, a plurality of sensor layers are deposited across the surface of the wafer. Thereafter, to establish a magnetic read track width for the sensor, a photolithographic process is conducted in which an ion milling mask is photolighographically fabricated above the sensor layers. An ion milling process is then conducted in which unmasked portions of the sensor layers are removed while the sensor layers that are protected by the mask remain. Further read sensor and magnetic head structures are subsequently fabricated, however the magnetic read track width of the sensor is determined in the ion milling process.

In order to achieve greater areal data storage density within the magnetic media, magnetic data bits are written in increasingly smaller sizes, and the magnetic read sensors of the magnetic heads must therefore be fabricated with a reduced magnetic read track width to properly read the smaller sized data bits. In prior art attempts of fabricate a magnetic head with a narrower read track width sensor, shorter wavelength photolithographic exposure energy is utilized to create the ion milling mask. A problem that is encountered in this process is that the photoresist layer must be thinner than desired in order to be properly exposed by the shorter wavelength energy to create the ion milling mask. However, the thinner photoresist mask is not adequately robust to survive the subsequent sensor layer ion milling step. The present invention provides a fabrication method for creating a more robust ion milling mask which avoids these problems.

SUMMARY OF THE INVENTION

The magnetic head fabrication method of the present invention is directed towards the fabrication of the read head sensor components of the magnetic head. In the fabrication method a plurality of read head sensor layers are fabricated across the surface of a wafer substrate. A chemical mechanical polishing (CMP) stop layer is deposited above the sensor layers. Thereafter, a first reactive ion etch (RIE) layer is fabricated upon the CMP stop layer. A second RIE layer is next deposited upon the first RIE layer, where the second RIE layer is etchable with a different ion species than the first RIE layer. A stencil layer is then deposited upon the second RIE layer, and the stencil layer is patterned to create an etching stencil, where the patterned stencil is formed with a width which corresponds to the desired magnetic read track width of the magnetic head sensor. An RIE step is then conducted in which the patterned stencil acts as an etching mask and the second RIE layer is etched. Another RIE step is then conducted with a different ion species from which the first RIE layer is etched, and the remaining second RIE layer acts as an etching mask. Thereafter, an ion milling step is conducted in which the sensor layers are milled, and in which the remaining portions of the first and second RIE layers act as a milling mask.

The hard bias elements and electrical leads are subsequently fabricated along side the remaining sensor layers, and a CMP step is then conducted in which the remaining portions of the ion milling mask are removed in a CMP assisted liftoff step. Following the fabrication of the read head structures, further magnetic head structures as are well known to those skilled in the art are fabricated to ultimately complete the fabrication of a magnetic head of the present invention.

In a preferred embodiment, the stencil layer is patterned utilizing deep ultraviolet (DUV) or e-beam sensitive resist, such that a narrower read track width stencil is fabricated. The first RIE step is conducted utilizing fluorine or chlorine ion species, and the second RIE step is conducted utilizing oxygen ion species.

It is an advantage of the method for fabricating a magnetic head of the present invention that a magnetic head sensor having a reduced magnetic read track width is created.

It is another advantage of the method for fabricating a magnetic head of the present invention that it facilitates the selection of a hard mask thickness for optimal sensor patterning and CMP assisted liftoff.

It is a further advantage of the method for fabricating a magnetic head of the present invention that it decouples the chemistry between the imaged stencil layer and the hard mask layer by the insertion of a hard reactive ion etch layer therebetween.

It is yet another advantage of the method for fabricating a magnetic head of the present invention that it facilitates the use of DUV or e-beam patterning of a stencil mask for optimal sensor magnetic read track width fabrication.

It is yet a further advantage of the method for fabricating a magnetic head of the present invention that it facilitates the use of a thinner stencil resist for DUV and e-beam patterning, along with a thicker hard mask for optimal sensor milling and CMP assisted liftoff.

It is an advantage of the magnetic head of the present invention that it has a reduced magnetic read track width.

It is another advantage of the magnetic head of the present invention that it is fabricated with DUV or e-beam patterning of a stencil mask for achieving an optimal sensor magnetic read track width.

It is an advantage of the hard disk drive of the present invention that it includes a magnetic head of the present invention in which the read track sensor width is reduced for increased areal data storage density of the hard disk drive.

It is another advantage of the hard disk drive of the present invention that it includes a magnetic head of the present invention that is fabricated with DUV or e-beam patterning of a stencil mask for achieving an optimal sensor magnetic read track width.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
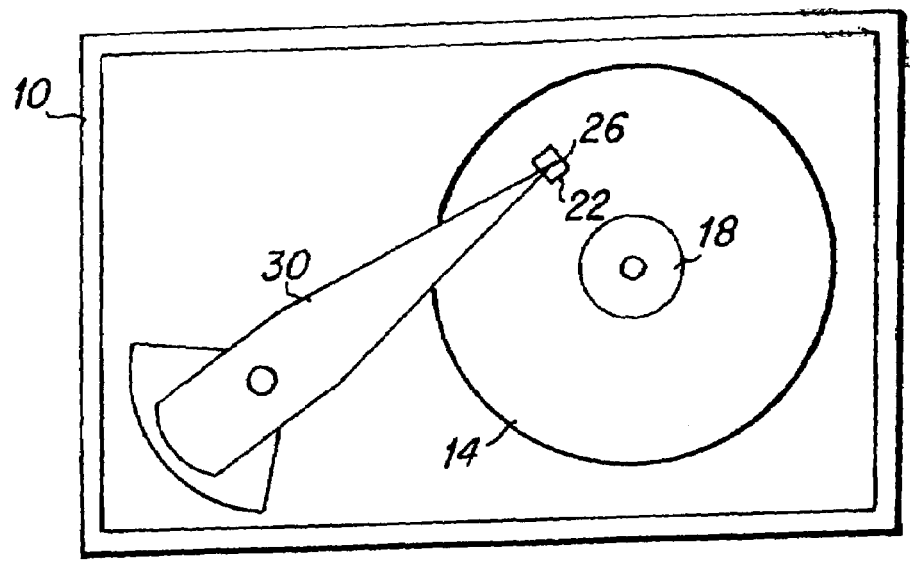
FIG. 1 is a schematic top plan view of a hard disk drive including the magnetic head of the present invention.

A simplified top plan view of a typical hard disk drive 10 which is suitable to include the magnetic head of the present invention is presented in FIG. 1. As depicted therein, at least one hard disk 14 is rotatably mounted upon a motorized spindle 18. A slider 22, having a magnetic head 26 fabricated thereon, is mounted upon an actuator arm 30 to fly above the surface of each rotating hard disk 14, as is well known to those skilled in the art. Such magnetic heads are created in large quantities in many fabrication steps that are conducted upon a wafer substrate, and the wafer substrate is subsequently sliced and diced to create the individual magnetic heads. The present invention includes improved features and manufacturing methods for such magnetic heads 26, and to better described the present invention a prior art magnetic head is next described.

Figure 2:
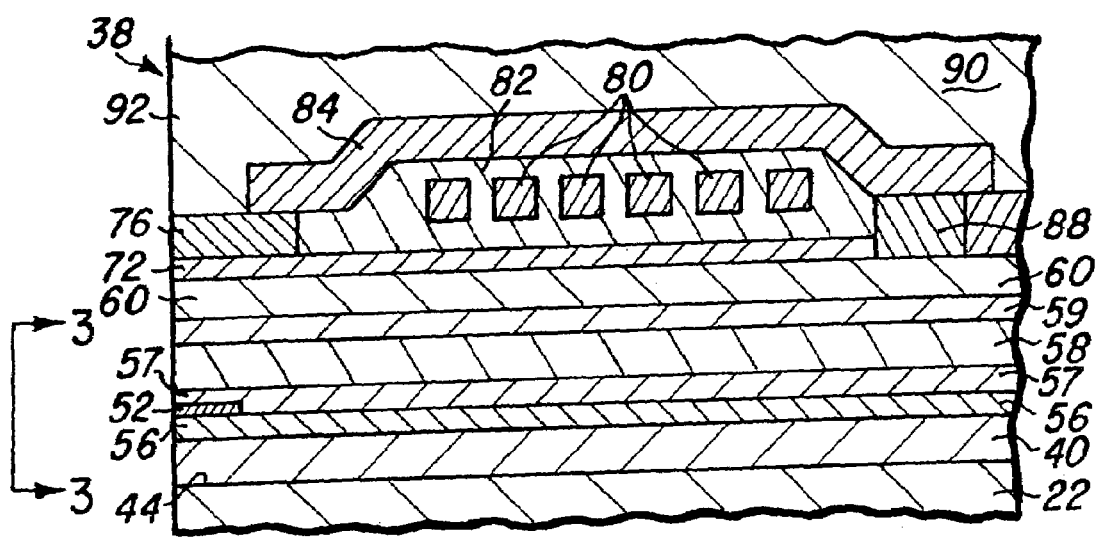
FIG. 2 is a side cross-sectional view depicting various components of a prior art magnetic head.

As will be understood by those skilled in the art, FIG. 2 is a side cross sectional view depicting portions of a basic prior art magnetic head 38. The magnetic head 38 includes a first magnetic shield layer (S1) 40 that is formed upon a surface 44 of the slider body material 22 of a wafer substrate. A read head sensor element 52 is fabricated upon a first insulating layer (G1) 56 and a second insulating layer (G2) 57 is deposited above the sensor 52. A second magnetic shield layer (S2) 58 is then formed upon the second insulation layer 57. An insulation layer 59 is then deposited upon the S2 shield 58, and a first magnetic pole (P1) 60 is fabricated upon the insulation layer 59.

Following the fabrication of the P1 pole layer 60, a write gap layer 72 is deposited, followed by the fabrication of a P2 magnetic pole tip 76. An induction coil including coil turns 80 may then be fabricated within insulation 82 above the write gap layer 72. A yoke portion 84 of the second magnetic pole is next fabricated in magnetic connection with the P2 pole tip 76, and through a back gap element 88 to the P1 pole layer 60. The head is subsequently encapsulated in alumina 90, and it is finally processed such that an air bearing surface (ABS) 92 is created. It is to be understood that this description omits many detailed fabrication steps for a magnetic head that are well known to those skilled in the art, and which are not deemed necessary to describe herein in order to provide a full understanding of the present invention.

Figure 3:
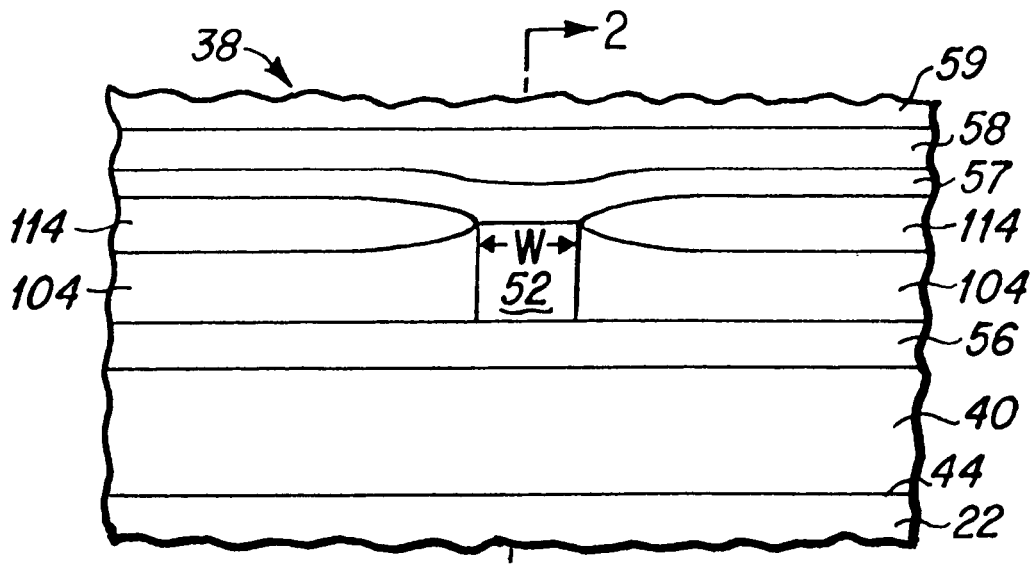
FIG. 3 is an elevational view of the prior art magnetic head depicted in FIG. 2, taken from the ABS along lines 3—3 of FIG. 2.

FIG. 3 is an elevational view of the read head sensor portion of the prior art magnetic head 38 depicted in FIG. 2 taken from the ABS; lines 2—2 are presented in FIG. 3 to clarify the relationship between FIGS. 2 and 3. As depicted in FIG. 3, the S1 shield 40 is formed upon the surface 44 of the slider body material 22 and a first insulating gap layer (G1) 56 is deposited upon the S1 shield 40. The read head sensor 52 element is fabricated with a magnetic read track width W upon the G1 layer 56 and hard bias elements 104 and electrical leads 114 for the sensor 52 are fabricated along side the sensor 52 upon the G1 layer 56. The second insulation layer (G2) 57 is deposited above the sensor 52 and upon the electrical leads 114, and the second magnetic shield layer (S2) 58 is fabricated above the G2 insulation layer 57.

A significant problem of the prior art magnetic head 38, as depicted in FIG. 3, occurs when it is desired to reduce the read track width W of the sensor 52 in an effort to produce a magnetic head for a hard disk drive having increased areal data storage density. Specifically, while advanced lithography tools are available, the resist and masking materials and methods are increasingly lacking in thin structure accuracy as smaller structures are required to be fabricated. A detailed description of this problem is next presented, followed by a detailed description of the fabrication method of the present invention which overcomes the problem.

Figure 4:
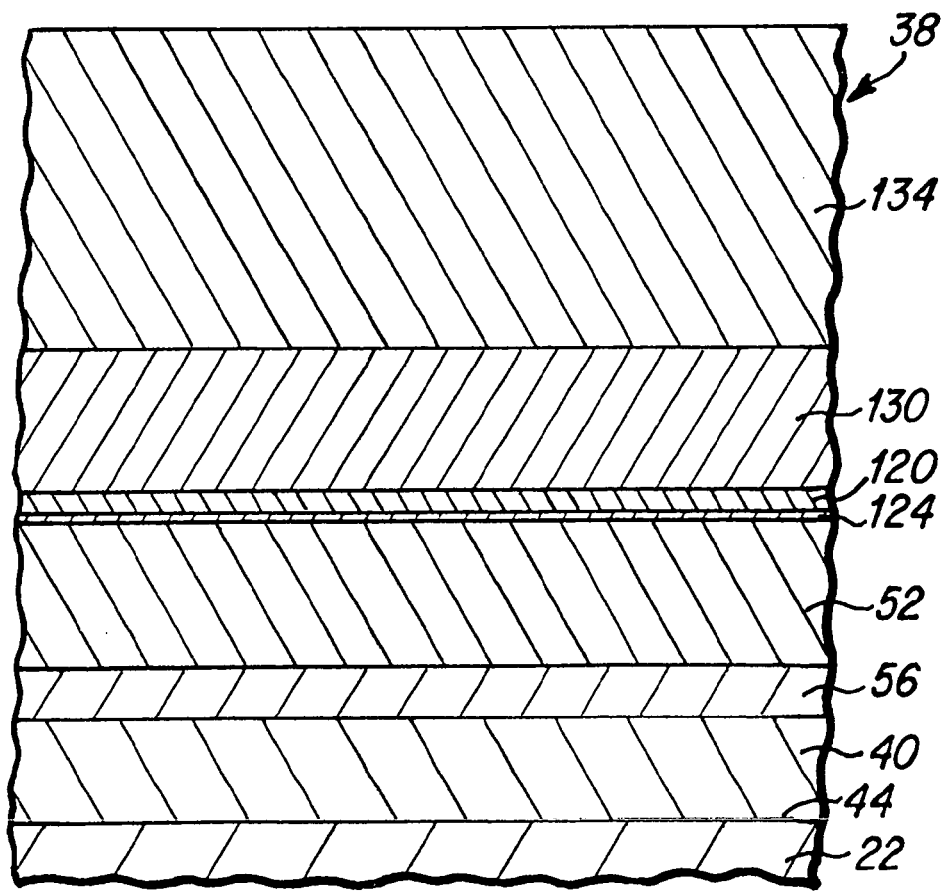
FIGS. 4–9 are elevational views depicting a series of fabrication steps utilized in fabricating the prior art magnetic head depicted in FIG. 3.

FIGS. 4–9 depict a series of prior art fabrication steps that are utilized to create the sensor 52 of the prior art magnetic head 38. With reference to FIG. 4, following the deposition of the first magnetic shield (S1) 40 upon the surface 44 of the slider body material 22, the G1 insulation layer 56 is deposited. Thereafter, a plurality of layers that comprise the sensor 52 are deposited across the surface of the wafer. The layers may typically include an antiparallel coupling layer, a fixed magnetic field layer, a non-magnetic spacer layer, and a free magnetic field layer. These sensor layers are not specifically shown in the figures in that they are well known to those skilled in the art, and the present invention, as described herebelow, is generally applicable to sensors having differing types and combinations of sensor layers, as will become clear from the description that follows. A chemical mechanical polishing (CMP) stop layer is next fabricated across the wafer upon the sensor layers. In the preferred embodiment, the CMP stop layer is comprised of a diamond-like-carbon (DLC) layer 120 which is fabricated with an initial deposition of a silicon adhesion layer 124, followed by the deposition of the DLC layer 120.

As is well known to those skilled in the art, to fabricate the sensor layers into the desired read track width W, an ion milling step is conducted in which the desired central portions of the sensor layers are masked and the undesired outer portions of the sensor layers are not masked, such that the undesired outer portions of the sensor layers are removed in the ion milling step. In the process of creating the mask for the ion milling step, a hard mask layer 130, preferably comprised of a substance such as Durimide is deposited across the surface of the wafer upon the DLC layer 120; Durimide is a registered trademark of Arch Chemicals, Inc., Norwalk, Conn., for polyimide coating materials for photolithographic processes. The Durimide layer 130 is thermally hardened and a photolithographic resist layer 134 is deposited upon the Durimide layer.

Figure 5:
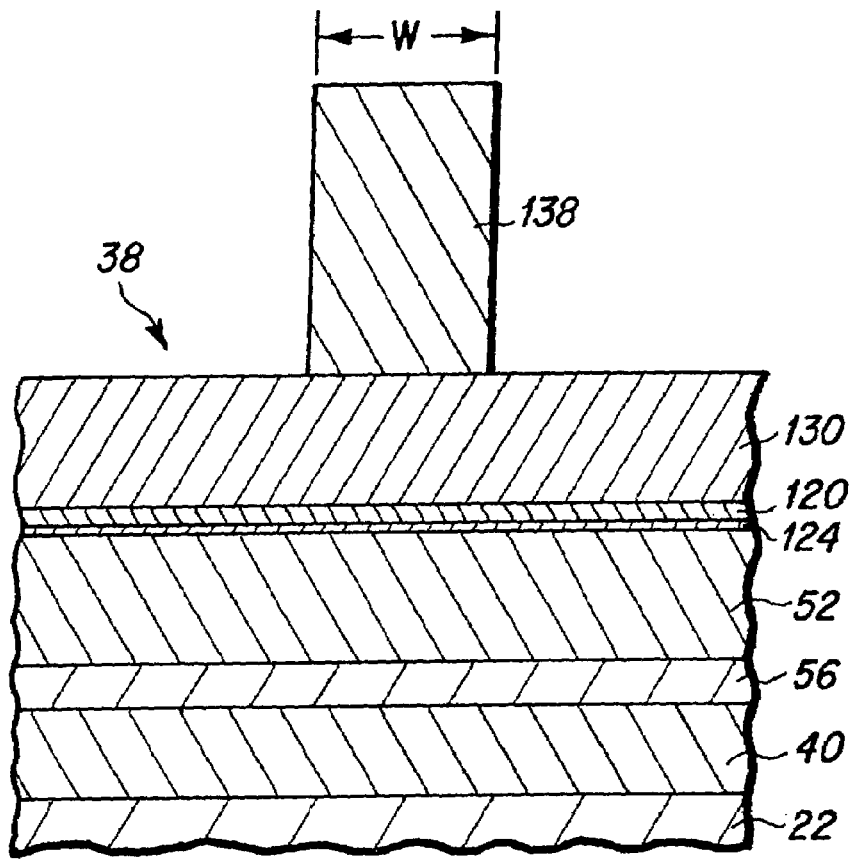
Figure 6:
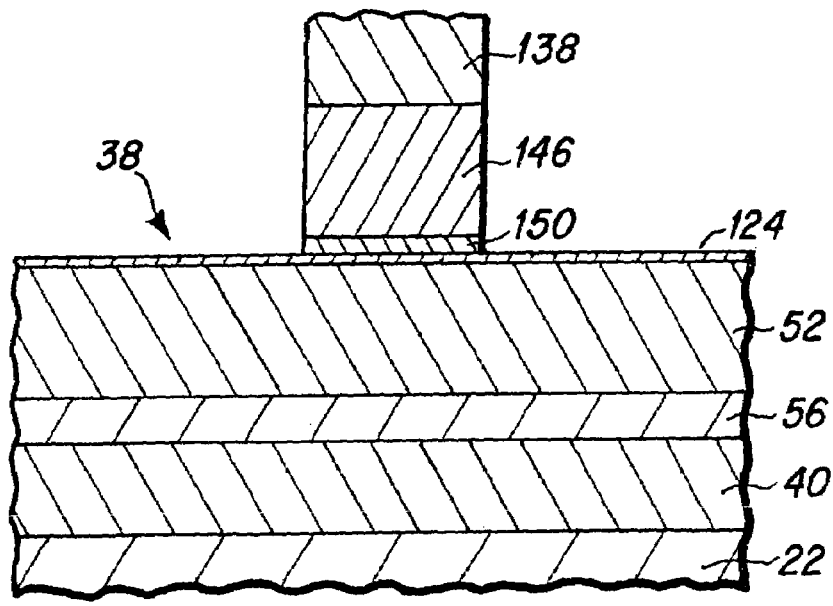

As is next depicted in FIG. 5, a patterned photolithographic exposure of the resist layer is conducted, such that a photoresist stencil 138 having the width of the desired read track width W of the sensor is created. The remaining resist is then removed, such as by utilizing a chemical stripper, whereupon the imaged stencil 138 remains in the central area. Thereafter, as depicted in FIG. 6, a reactive ion etch (RIE) process is conducted, utilizing $CO_2$ or $O_2$ based ion species to etch away the organic based layers that are not covered by the resist stencil. As is depicted in FIG. 6, the oxygen based RIE process removes the unprotected outer portion of the Durimide as well as the unprotected DLC layer below the Durimide; the silicon adhesion layer 124 acts as an RIE stop layer in that it is not removed in the oxygen based RIE process. The stencil protected portion 146 of the Durimide layer, and the protected central portion 150 of the DLC layer, remain above the sensor layer 52. Importantly, as depicted in FIG. 5, significant upper portions of the resist stencil 138 are also removed in the oxygen based RIE process because the resist is formed of an organic compound that is susceptible to the oxygen RIE process.

Figure 7:
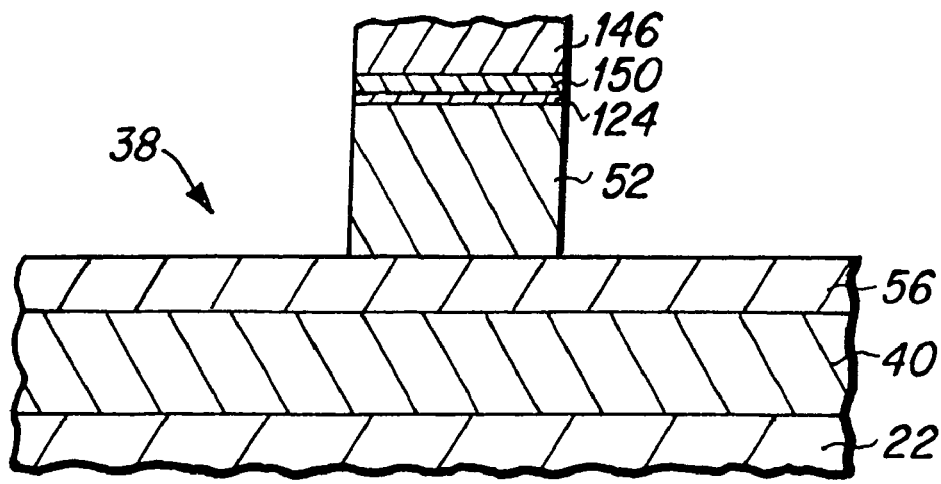
Figure 8:
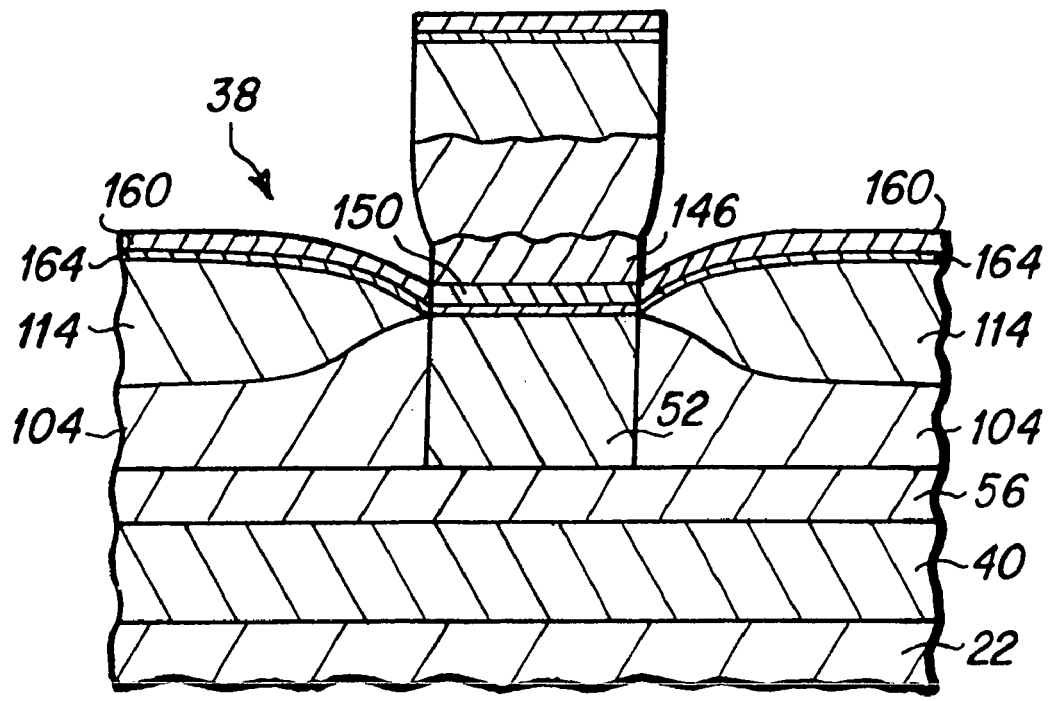

As is next depicted in FIG. 7, a typical ion milling process is next conducted to remove the outer portions of the sensor layers. The Durimide layer portion 146 with the remaining portion of the resist stencil 138 acts as the ion milling mask in the sensor layer milling process. The resist 138 and significant portions of the Durimide layer 146 are typically also removed in the sensor layer ion milling process. As depicted in FIG. 8, following the sensor ion milling process, hard bias elements 104 and electrical leads 114 are fabricated along side the remaining sensor layers. The material comprising the hard bias and electrical leads is also deposited upon the remaining Durimide mask 146. Thereafter, a DLC layer 160, which includes an initial silicon adhesion layer 164 is fabricated across the wafer and upon the electrical leads.

Figure 9:
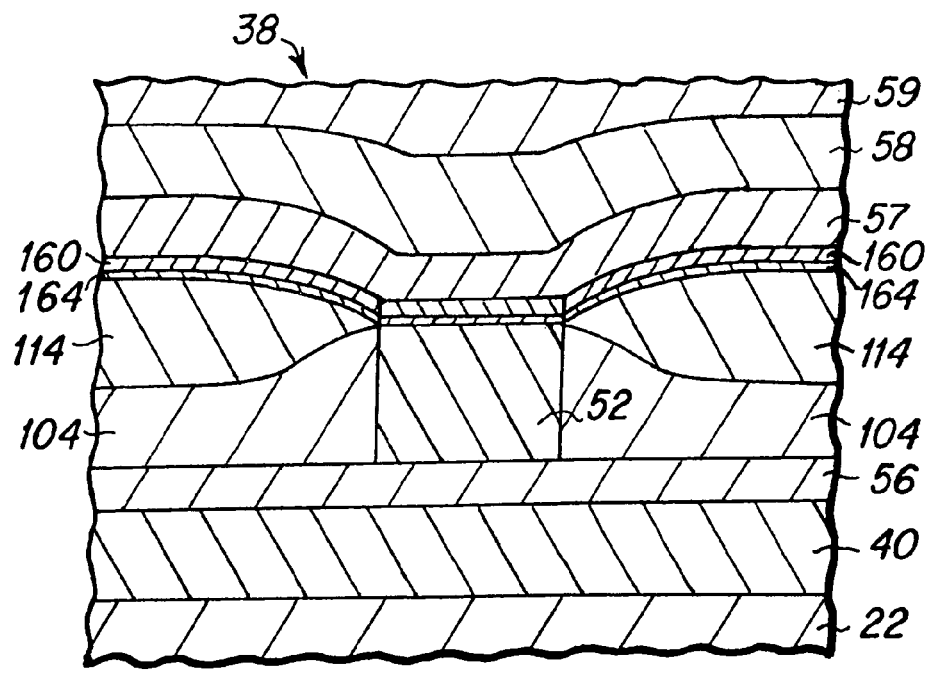

As is next depicted in FIG. 9, a CMP assisted liftoff step is next conducted in which the DLC layers 160 on top of the electrical leads 114 and the DLC layer 150 on top of the sensor 52 act as polishing stops in the CMP liftoff step. In the CMP liftoff step the remaining Durimide masking material 146 and layers of material that have been deposited above the Durimide are desired to be completely removed. Following the CMP step the G2 insulation layer and S2 magnetic shield layer, as depicted in FIG. 3, and described hereabove, are fabricated. Thereafter, further elements and structures of the magnetic head 38, as are well known to those skilled in the art, are fabricated.

In a fabrication process of the type described above, for creating a read sensor with a read track width W as low as approximately 70 nm, a film stack including a 100 Å DLC layer, a 600 Å Durimide layer and a 2,500 Å resist layer may typically be utilized.

Where it is desired to reduce the read track width W of the sensor to dimensions below approximately 70 nm, certain problems are encountered in utilizing the fabrication process described above. Initially, in order to achieve accurate photolithographic patterning of the resist layer at dimensions below approximately 70 nm it is necessary to utilize a shorter wavelength photolithographic exposure energy, and photolithographic energy in the deep ultraviolet spectrum (DUV) or e-beam energy must be utilized to achieve accurate stenciling for a narrow read track width stencil. Significantly, however, the thickness of the resist layer must be reduced to submicron values due to the lithographic patterning properties of the DUV or e-beam resist. That is, the relatively thick resist layer 138 utilized in the prior art sensor imaging process is not completely exposed through its thickness for proper photolithographic stenciling where DUV or e-beam exposure energies are utilized. As a result, the stenciling resist must be significantly thinner when photolithographic stenciling is accomplished utilizing DUV or e-beam exposure. However, such a thin stenciling resist is insufficient to effectively transfer the stencil pattern into the Durimide hard mask layer 130 by the prior art RIE process, because it will not survive the oxygen based RIE process that is utilized to pattern the Durimide. That is, the oxygen based RIE process will remove the resist stencil 138 prior to the complete removal of the Durimide 130. If a thinner Durimide layer 130 is utilized to avoid this problem, then the Durimide layer may not be sufficiently thick to accomplish the masking of the sensor layers 52 in the subsequent sensor layer ion milling process. Additionally, while the thickness of the Durimide layer 146 is somewhat is somewhat a function of the desired read track width, it is desirable that a relatively thick Durimide layer 146 exist above the DLC layer 150 at the completion of the sensor ion milling process. This is important in order that the subsequent CMP assisted liftoff step be effective in removing the Durimide 146 and other layers that reside above the DLC layer 150 of the sensor. Specifically, as will be understood by those skilled in the art, where only a thin layer of Durimide remains above the sensor DLC layer 150 following the sensor ion milling step, this thin Durimide layer is mechanically stronger and more resistant to breaking, and it is quite difficult for the CMP assisted liftoff process to remove it. However, where a thicker layer of Durimide 146 exists above the sensor DLC layer 150 following the ion milling step, a CMP assisted liftoff process is better able to mechanically attack and remove the thicker Durimide layer 146 than where the Durimide layer is thinner.

Figure 10:
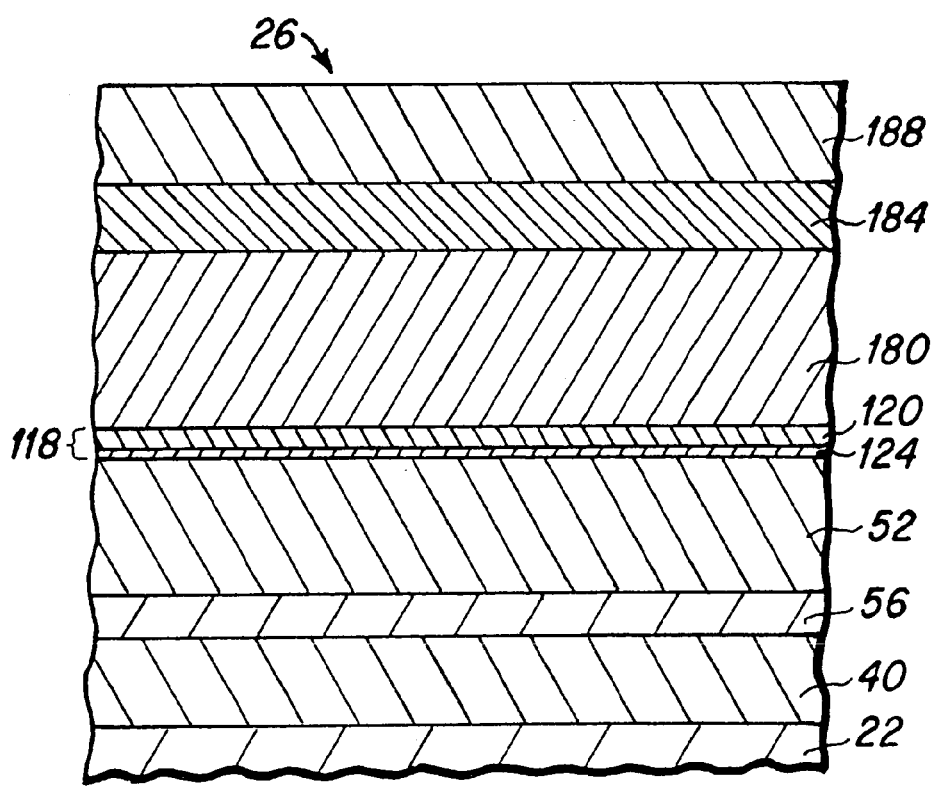
FIGS. 10–15 are elevational views depicting the fabrication method of the present invention.

The magnetic head 26 of the present invention having a reduced read track width is created with improved fabrication techniques for creating the read sensor, and the fabrication of the magnetic head is next described with the aid of FIGS. 10–15. FIG. 10 is an cross-sectional view of a first step of the magnetic head fabrication method of the present invention in which an S1 shield layer 40 is deposited upon a substrate base, followed by a G1 insulation layer 56 and a plurality of sensor layers 52, all as described hereabove. A mask removal layer 118, which may be a DLC layer 120 that includes a silicon adhesion layer 124, is deposited upon the sensor layer 52, followed by the fabrication of a Durimide hard mask layer 180. Thereafter, a new masking layer 184 is deposited upon the Durimide layer 180. The new masking layer 184 is comprised of a substance that is etchable an RIE process utilizing an ion species other than that which is utilized for the first RIE layer 180, such as a fluorine or chlorine ion based RIE process using a gas such as $CF_4$, $CCl_4$ or $CHF_3$. Suitable materials for fabricating the new masking layer 184 comprise $SiO_2$, $Si_3N_4$, $SiO_xN_y$, $Al_2O_3$, AlN, or a metal hardmask comprised of a material such as W, Mo, Ta and TiN. Following the deposition of the new masking layer 184, the stenciling photoresist layer 188 is deposited. The imaging process of the present invention utilizes the shorter wavelength DUV or e-beam exposure energies to achieve accurate stenciling below the approximately 70 nm sensor read track widths of the prior art, and a reduced thickness of the photoresist layer 188 is selected to be suitable for these energies.

Figure 11:
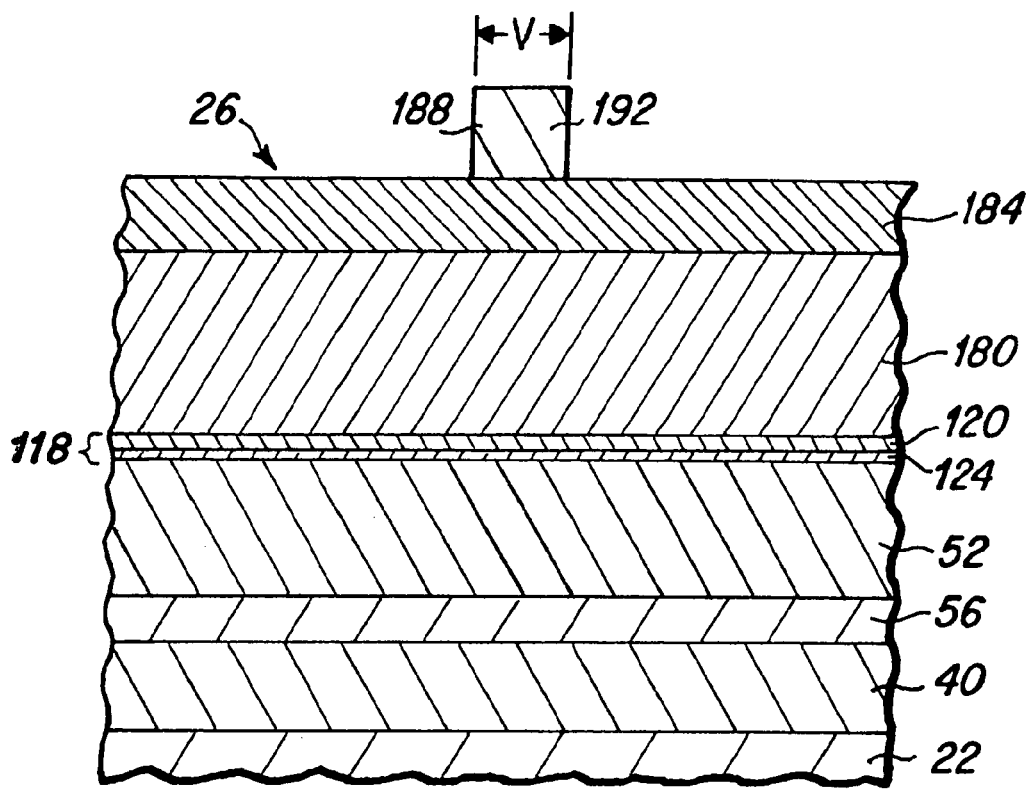
Figure 12:
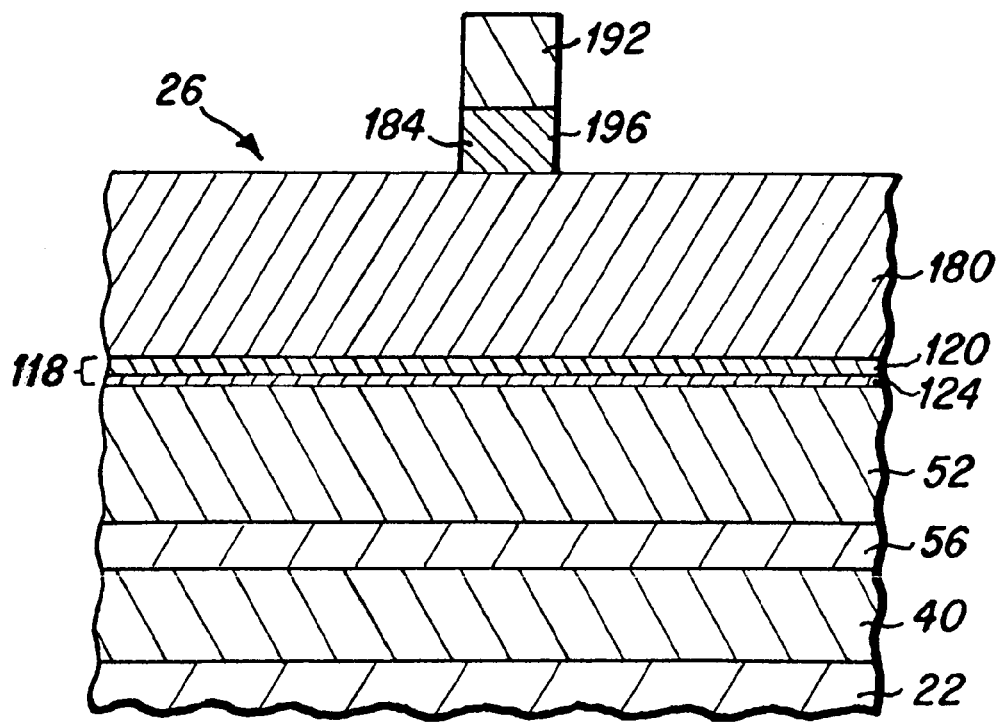

As depicted in FIG. 11, after depositing the resist layer 188 to the desired thickness for imaging, the resist layer is then photolithographically imaged with DUV or e-beam energy in a stenciling pattern 192 that has a mask width V of the desired read track width of the sensor, which can now be significantly less than the approximately 70 mm lower limit of the prior art. The unexposed portions of the photoresist are then removed, such as by using a wet chemical stripper. As depicted in FIG. 12, a first RIE process is then conducted utilizing a non-oxygen based RIE process, such as a fluorine or chlorine ion based RIE process. The material comprising the exposed new masking layer 184 is susceptible to the fluorine or chlorine based RIE process and the resist stencil 192 acts as a mask in shielding the central portion 196 of the new masking layer 184, while the outer unmasked portions of the new masking layer are removed in the fluorine or chlorine based RIE process. The selectivity of the Durimide layer 180 is lower in the fluorine or chlorine RIE process.

Figure 13:
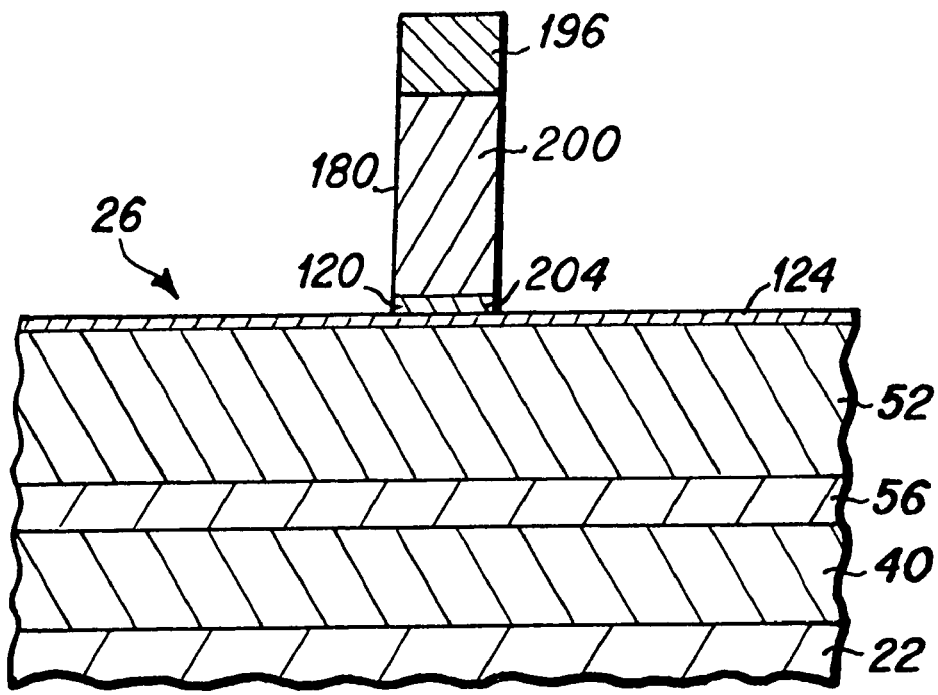

Thereafter, as depicted in FIG. 13, a second RIE process is conducted utilizing an oxygen based RIE. In this oxygen based RIE process the outer portions of the Durimide layer 180 and DLC layer 150 are removed while the central portion 200 of the Durimide layer and DLC layer 204 are shielded by the new masking layer 196. The silicon adhesion layer 124 acts as an oxygen RIE stop layer. It is significant to note that even where the resist stencil layer is entirely removed in this oxygen RIE process, the new masking layer 196, being not susceptible to removal in the oxygen based RIE process, remains as a hard mask over the central portion 200 of the Durimide layer during this oxygen RIE process. As a result, the thickness of the Durimide layer 180 can be independently selected to optimize the subsequent sensor layer ion milling process and the following CMP assisted liftoff process, as are next described. It is to be noted that other well known hard mask 180 materials, such as Barli or epoxy compounds or a hard baked resist may be utilized in place of the Durimide in the present invention. Barli is a registered trademark of Clariant A G, Muttenz, Switzerland for a photosensitive material.

Figure 14:
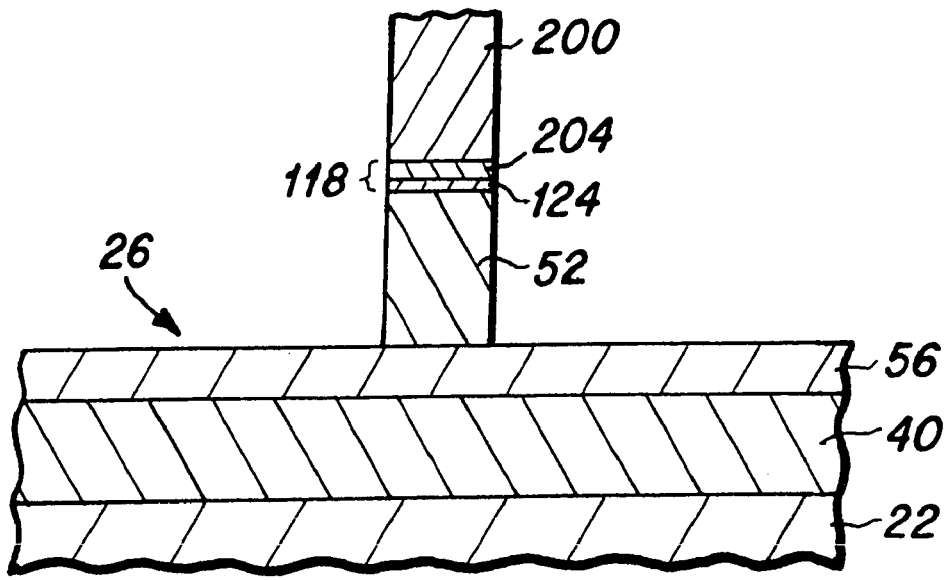
Figure 15:
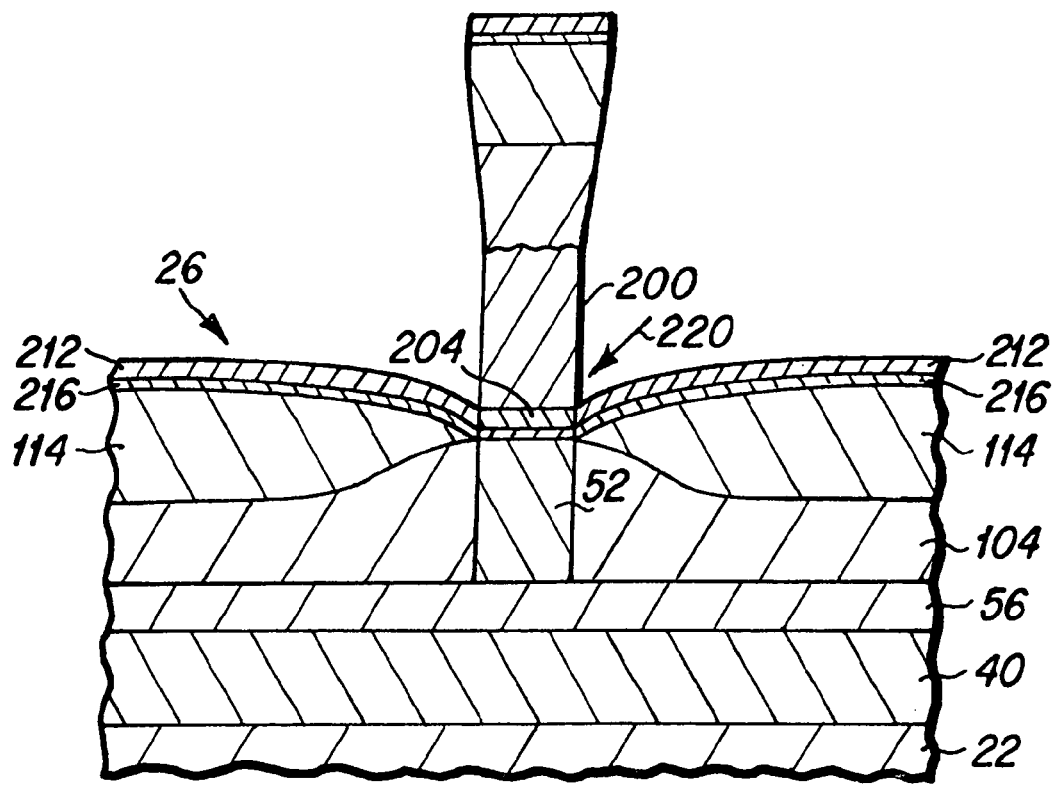

Thereafter, as depicted in FIG. 14, the sensor layer ion milling process is conducted, in which the new masking layer 196 and Durimide 200 and DLC layer 204 act as a central mask over the central portion of the sensor layer, while the outer portions of the sensor layer are removed by the ion milling process down to the G1 layer 56. Substantial portions of the Durimide mask 200 remain, as the thickness of the Durimide layer was selectively chosen for this purpose. Thereafter, as depicted in FIG. 15, the hard bias elements 104 and electrical leads 114 are fabricated along side the sensor layer 52. As has been previously described, an upper DLC layer 212, including a silicon adhesion layer 216 is next deposited above the electrical leads 114.

Following the deposition of the upper DLC layers 212 a CMP assisted liftoff process is conducted in which the central masking elements 200 are removed. Because the Durimide layer 180 has been fabricated with an adequate thickness, the Durimide portion 200 of the mask stack projects high enough that the CMP assisted liftoff process will mechanically attack it and cause it to break off at a location (see arrow 220) close to the DLC layer 204 of the sensor. Thereafter, the further polishing effect of the CMP assisted liftoff step more easily removes the remaining Durimide, such that the sensor is desirably polished down to the DLC layer of the sensor as is depicted in FIG. 15.

Figure 16:
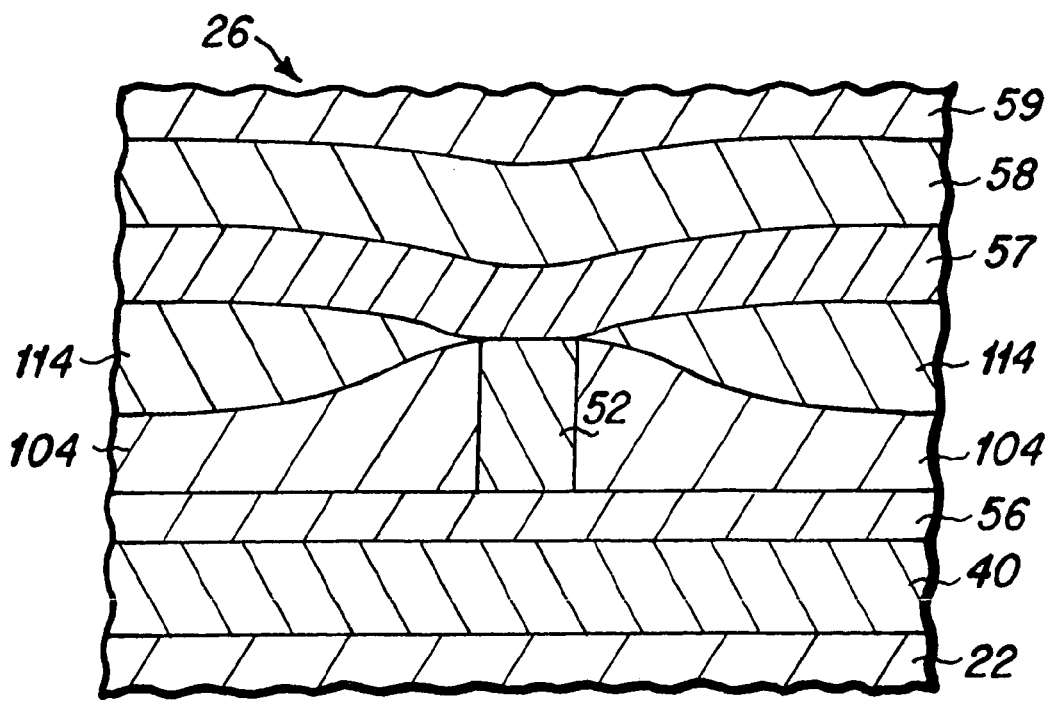
FIG. 16 is an elevational view depicting a magnetic head of the present invention.

Thereafter, as is depicted in FIG. 16, the DLC layer is first removed in an RIE process, such as an oxygen RIE, and the G2 insulation layer and S2 magnetic shield layer are then fabricated upon the wafer. Thereafter, further magnetic head layers, elements and structures as are known to those skilled in the art and described hereabove with the aid of FIGS. 2 and 3 are fabricated to complete the fabrication of the magnetic head of the present invention which is utilized in a hard disk drive of the present invention. A feature of the present invention is that it utilizes shorter wavelength DUV or e-beam energy to fabricate the stencil that results in the creation of a read sensor having a narrower magnetic read track width W. Where the DUV and e-beam energy is utilized, the stenciling resist 192 must be relatively thin to be properly photolithographically exposed. The two RIE layers 184 and 180 are provided to create a robust ion milling mask for milling the read head sensor layers to create the MR sensor 52 having the desired narrow read track width V.

In the fabrication process of the present invention, for creating a read sensor with a read track with V below approximately 70 nm, a film stack including an approximately 100 Å to 300 Å DLC layer, a 600 Å–1,500 Å Durimide or other first RIE layer material, a 300 Å–1,000 Å second RIE layer and a stenciling layer of 150 nm–300 nm thickness of 248 nm, 193 nm, 157 nm or e-beam resist may be utilized.

In an alternative embodiment of the present invention, the read head CMP stop layer, previously identified as a DLC layer 120 with an adhesion layer 124, can be replaced with a CMP stop layer that is comprised of other materials such as FCA, IBD, a hard insulation material for a hard metal, as are known to those skilled in the art. Where the CMP stop layer is comprised of a carbon based compound, it is removed along with the Durimide layer in the second, oxygen based RIE step. However, where the CMP strop layer is comprised of a material that is not susceptible to RIE removal, then the CMP stop layer is removed by ion milling the start of the sensor ion milling step such that both the CMP layer and the outer portions of the sensor layer are removed during that ion milling step.

While the preceding disclosure has primarily focused on the removal of the ion milling mask through the use of a CMP assisted liftoff process that requires a hard CMP stop layer, the removal of the ion milling mask can also be accomplished utilizing a wet chemical liftoff approach. In this alternative approach, a mask removal layer 118, which is formed as a liftoff layer that is comprised of a material such as PMGI, is deposited on top of the sensor layers in place of the DLC layer 120 and its adhesion layer 124. Further process steps are conducted as has been described hereabove through the second RIE step which removes the Durimide layer and the outer portions of the PMGI layer. Next, an additional process step is undertaken in which a wet chemical stripper is utilized to form undercuts in the exposed side edges of the PMGI layer. Thereafter, the ion milling of the sensor layers followed by the fabrication of the hard bias elements and electrical leads is conducted as previously described. Now, following the fabrication of the electrical leads, the ion milling mask can be removed in a wet chemical liftoff process in which a chemical stripper is utilized to attack and remove the PMGI layer through the undercuts that have previously been created. This process is therefore an alternative to the CMP assisted liftoff process, and it facilitates the fabrication of the desired read track width sensor utilizing a stencil that is fabricated utilizing DUV or e-beam resist.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

We claim:

1. A method for fabricating a magnetic head, comprising:
   fabricating a plurality of read head sensor layers;
   fabricating a mask removal layer upon said read head sensor layers;
   fabricating a first reactive ion etch (RIE) layer upon said mask removal layer;
   fabricating a second RIE layer upon said first RIE layer, where said second RIE layer is etchable with a different ion species than said first RIE layer;
   fabricating a stencil layer upon said second RIE layer;
   patterning said stencil layer to create an etching stencil;
   etching said second RIE layer, where said stencil acts as a first RIE mask;

etching said first RIE layer, where said second RIE layer acts as a second RIE etching mask;

milling said read head sensor layers in an ion milling step to create a read sensor having a read track width W where said first RIE layer acts as a milling mask;

performing a mask removal step to remove remaining portions of said first RIE etching mask and said second RIE etching mask.

2. A method for fabricating a magnetic head as described in claim 1 wherein said second RIE layer is etchable with a fluorine or chlorine ion species.

3. A method for fabricating a magnetic head as described in claim 1 wherein said first RIE layer is etchable utilizing oxygen ion species.

4. A method for fabricating a magnetic head as described in claim 1 wherein said mask removal layer is comprised of a material that is susceptible to wet chemical stripping, and wherein said mask removal step comprises a wet chemical stripping process.

5. A method for fabricating a magnetic head as described in claim 1, wherein said stencil layer is patterned using DUV or e-beam energy.

6. A method for fabricating a magnetic head as described in claim 5 further including the steps of fabricating a hard bias element and an electrical lead element at side locations of said read head sensor layers.

7. A method for fabricating a magnetic head as described in claim 6 wherein said mask removal layer includes a CMP stop layer, and including the further step of fabricating an electrical lead CMP stop layer upon said electrical lead element and wherein said mask removal step includes a CMP step.

8. A method for fabricating a magnetic head as described in claim 1, wherein said first RIE layer is comprised of Durimide.

9. A method for fabricating a magnetic head as described in claim 1, wherein said second RIE layer is comprised of a material selected from the group consisting of $SiO_2$, $Si_3N_4$, $SiO_xN_y$, $Al_2O_3$, AlN, W, Mo, Ta and TiN.

10. A method for fabricating a magnetic head as described in claim 1 wherein said first RIE layer is formed with a thickness of approximately 600 Å to 1,500 Å.

11. A method for fabricating a magnetic head as described in claim 1 wherein said second RIE layer is formed with a thickness of approximately 300 Å to 1,000 Å.

12. A method for fabricating a magnetic head as described in claim 1, wherein said stencil layer is formed with a thickness of approximately 150 nm to 300 nm.

13. A method for fabricating a magnetic head, comprising:
fabricating a plurality of read head sensor layers;
fabricating a first reactive ion etch (RIE) stop layer upon said read head sensor layers;
fabricating a read sensor CMP stop layer upon said first RIE stop layer;
fabricating a first reactive ion etch (RIE) layer upon said CMP stop layer;
fabricating a second RIE layer upon said first RIE layer, where said second RIE layer is etchable with a different ion species than said first RIE layer;
fabricating a stencil layer upon said second RIE layer;
fabricating a read sensor track width stencil from said stencil layer;
etching said second RIE layer down to said first RIE layer, where said stencil acts as a first RIE etching mask;
etching said first RIE layer down to said first RIE stop layer, where said second RIE layer acts as a second RIE etching mask;
milling said read head sensor layers in an ion milling step, where said first RIE layer acts as a milling mask;
fabricating a hard bias element and an electrical lead element at side locations of said read head sensor layers;
fabricating an electrical lead CMP stop layer upon said electrical lead element prior to performing a CMP step; and
performing said CMP step to remove remaining portions of said first RIE etching mask and said second RIE etching mask down to said read sensor CMP stop layer.

14. A method for fabricating a magnetic head as described in claim 13 wherein said stencil layer is patterned using DUV or e-beam energy, said second RIE layer is etchable with fluorine or chlorine ion species, and said first RIE layer is etchable utilizing oxygen ion species.

15. A method for fabricating a magnetic head as described in claim 14, wherein said first RIE layer is comprised of a material selected from the group consisting of Durimide, Barli and a hard baked resist;
said second RIE layer is comprised of a material selected from the group consisting of $SiO_2$, $Si_3N_4$, $SiO_xN_y$, $Al_2O_3$, AlN, W, Mo, Ta and TiN; and
said read sensor CMP stop layer is comprised of DLC, and said electrical lead CMP stop layer is comprised of DLC.

16. A method for fabricating a magnetic head as described in claim 15 wherein said first RIE layer is formed with a thickness of approximately 600 Å to 1,500 Å, and said second RIE layer is formed with a thickness of approximately 300 Å to 1,000 Å, and said stencil layer is formed with a thickness of approximately 150 nm to 300 nm.

17. A magnetic head that is fabricated by a method comprising:
fabricating a plurality of read head sensor layers;
fabricating a first reactive ion etch (RIE) stop layer upon said read head sensor layers;
fabricating a read sensor CMP stop layer upon said first RIE stop layer;
fabricating a first reactive ion etch (RIE) layer upon said CMP stop layer;
fabricating a second RIE layer upon said first RIE layer, where said second RIE layer is etchable with a different ion species than said first RIE layer;
fabricating a stencil layer upon said second RIE layer;
fabricating a read sensor track width stencil from said stencil layer;
etching said second RIE layer down to said first RIE layer, where said stencil acts as a first RIE etching mask;
etching said first RIE layer down to said first RIE stop layer, where said second RIE layer acts as a second RIE etching mask;
milling said read head sensor layers in an ion milling step, where said first RIE layer acts as a milling mask;
fabricating a hard bias element and an electrical lead element at side locations of said read head sensor layers;
fabricating an electrical lead CMP stop layer upon said electrical lead element prior to performing a CMP step; and
performing said CMP step to remove remaining portions of said first RIE etching mask and said second RIE etching mask down to said read sensor CMP stop layer.

18. A magnetic head as described in claim 17 wherein said stencil layer is patterned using DUV or e-beam energy, said second RIE layer is etchable with fluorine or chlorine ion species, and said first RIE layer is etchable utilizing oxygen ion species.

19. A magnetic head as described in claim 18, wherein said first RIE layer is comprised of a material selected from the group consisting of Durimide, Barli and a hard baked resist;

said second RIE layer is comprised of a material selected from the group consisting of $SiO_2$, $Si_3N_4$, $SiO_xN_y$, $Al_2O_3$, AlN, W, Mo, Ta and TiN; and said read sensor CMP stop layer is comprised of DLC, and said electrical lead CMP stop layer is comprised of DLC.

20. A magnetic head as described in claim 19 wherein said first RIE layer is formed with a thickness of approximately 600 Å to 1,500 Å, and said second RIE layer is formed with a thickness of approximately 300 Å to 1,000 Å, and said stencil layer is formed with a thickness of approximately 150 nm to 300 nm.

21. A hard disk drive including a magnetic head that is fabricated by a method comprising:

fabricating a plurality of read head sensor layers;

fabricating a first reactive ion etch (RIE) stop layer upon said read head sensor layers;

fabricating a read sensor CMP stop layer upon said first RIE stop layer;

fabricating a first reactive ion etch (RIE) layer upon said CMP stop layer;

fabricating a second RIE layer upon said first RIE layer, where said second RIE layer is etchable with a different ion species than said first RIE layer;

fabricating a stencil layer upon said second RIE layer;

fabricating a read sensor track width stencil from said stencil layer;

etching said second RIE layer down to said first RIE layer, where said stencil acts as a first RIE etching mask;

etching said first RIE layer down to said first RIE stop layer, where said second RIE layer acts as a second RIE etching mask;

milling said read head sensor layers in an ion milling step, where said first RIE layer acts as a milling mask;

fabricating a hard bias element and an electrical lead element at side locations of said read head sensor layers;

fabricating an electrical lead CMP stop layer upon said electrical lead element prior to performing a CMP step; and performing said CMP step to remove remaining portions of said first RIE etching mask and said second RIE etching mask down to said read sensor CMP stop layer.

22. A hard disk drive as described in claim 21 wherein said stencil layer is patterned using DUV or e-beam energy, said second RIE layer is etchable with fluorine or chlorine ion species, and said first RIE layer is etchable utilizing oxygen ion species.

23. A hard disk drive as described in claim 22, wherein said first RIE layer is comprised of a material selected from the group consisting of Durimide, Barli and a hard baked resist;

said second RIE layer is comprised of a material selected from the group consisting of $SiO_2$, $Si_3N_4$, $SiO_xN_y$, $Al_2O_3$, AlN, W, Mo, Ta and TiN; and said read sensor CMP stop layer is comprised of DLC, and said electrical lead CMP stop layer is comprised of DLC.

24. A hard disk drive as described in claim 23 wherein said first RIE layer is formed with a thickness of approximately 600 Å to 1,500 Å, and said second RIE layer is formed with a thickness of approximately 300 Å to 1,000 Å, and said stencil layer is formed with a thickness of approximately 150 nm to 300 nm.

* * * * *